United States Patent [19]

Bellows et al.

[11] Patent Number: 4,838,041
[45] Date of Patent: Jun. 13, 1989

[54] EXPANSION/EVAPORATION COOLING SYSTEM FOR MICROELECTRONIC DEVICES

[75] Inventors: Alfred H. Bellows, Wayland; Glenn A. Duchene, Marlboro, both of Mass.

[73] Assignee: GTE Laboratories Incorporated, Waltham, Mass.

[21] Appl. No.: 10,914

[22] Filed: Feb. 5, 1987

[51] Int. Cl.[4] ............ F25B 19/02; H02B 1/00; H05K 7/20
[52] U.S. Cl. .................. 62/51.2; 62/293; 361/383; 165/80.2; 165/908
[58] Field of Search ............ 62/293, 514 R, 514 JT; 361/383, 384, 385; 165/47, 80.2, 908

[56] References Cited

U.S. PATENT DOCUMENTS

| | | | |
|---|---|---|---|
| 2,925,722 | 2/1960 | Blacklawn et al. | 62/514 R |
| 3,431,749 | 3/1969 | Bounds et al. | 62/293 |
| 3,573,557 | 4/1971 | Riggs | 361/385 |
| 3,696,813 | 10/1972 | Wallach | 62/514 R |
| 3,820,352 | 6/1974 | Mahler | 62/514 R |
| 4,305,261 | 12/1981 | Becker et al. | 62/514 R |
| 4,386,505 | 6/1983 | Little | 62/514 R |
| 4,392,362 | 7/1983 | Little | 62/514 R |
| 4,489,570 | 12/1984 | Little | 62/514 R |
| 4,546,621 | 10/1985 | Kline et al. | 62/514 R |
| 4,614,227 | 9/1986 | Vogel | 361/385 |

FOREIGN PATENT DOCUMENTS

| | | | |
|---|---|---|---|
| 0567039 | 8/1977 | U.S.S.R. | 62/514 R |
| 0658368 | 4/1979 | U.S.S.R. | 62/514 JT |

*Primary Examiner*—Albert W. Davis, Jr.
*Assistant Examiner*—John K. Ford
*Attorney, Agent, or Firm*—Wolf, Greenfield & Sacks

[57] ABSTRACT

Apparatus for cooling a semiconductor device by expansion cooling and/or evaporative cooling with a nontoxic gas includes a heat exchanger in thermal contact with the device to be cooled. A stream of expanding gas is released from a pressurized gas or liquid source through an expansion valve and is directed toward a heat exchange surface of the heat exchanger. The heat exchange surface includes fins which extend outwardly from the expansion valve and define grooves that direct the expanding gas over the heat exchange surface. The fins and grooves can be radial, spiral or branching for efficient thermal transfer. The grooves increase in cross-sectional area with radial distance from the expansion valve to accommodate the expanding gas volume. When a liquid is utilized, the liquid evaporates upon passing through the expansion valve, thereby providing both evaporative cooling and expansion cooling.

10 Claims, 2 Drawing Sheets

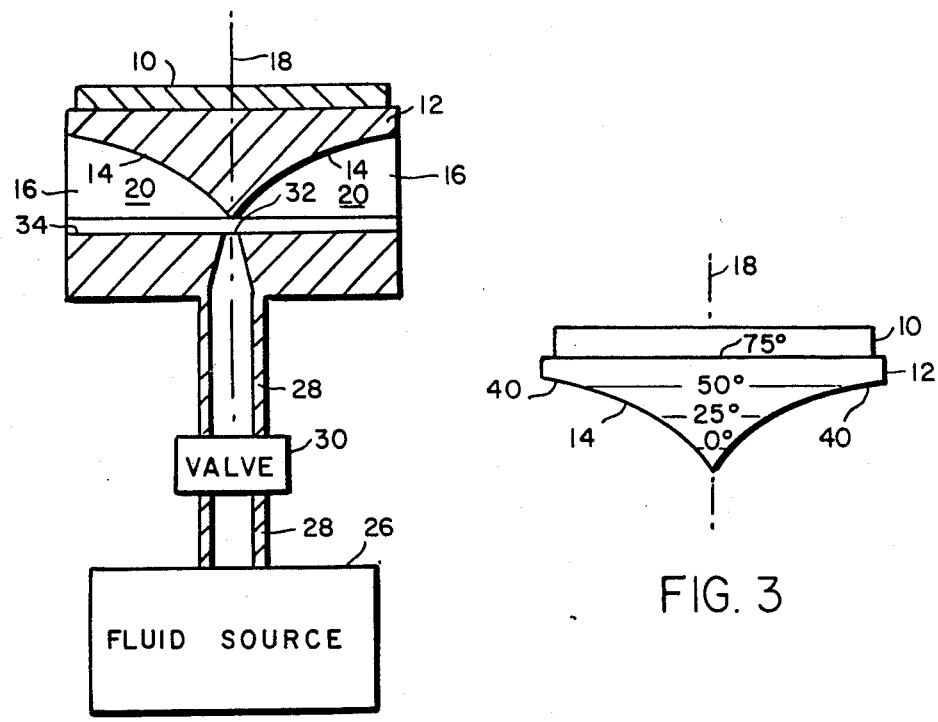
FIG. 1
FIG. 3
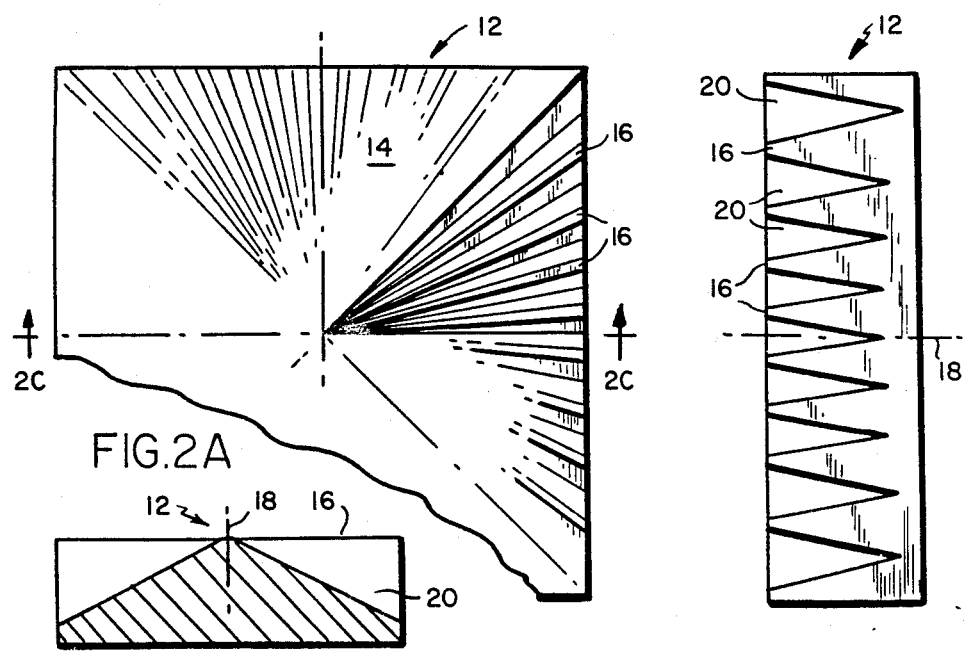
FIG. 2A
FIG. 2C
FIG. 2B

EXPANSION/EVAPORATION COOLING SYSTEM FOR MICROELECTRONIC DEVICES

FIELD OF THE INVENTION

This invention relates to apparatus for cooling electrical circuit components and, more particularly, to cooling apparatus which utilizes expansion cooling and/or evaporative cooling with a nontoxic gas.

BACKGROUND OF THE INVENTION

Present day microelectronic circuits usually operate at moderate power levels and can be adequately cooled by natural or forced convection of air. Cooling can be enhanced by attaching heat-generating devices to thermally conductive heat sinks which spread the heat over a large surface area for contact with the circulating air. Circulation of cooled water through heat sinks and other heat exchangers have also been utilized for cooling microelectronic circuitry.

In some cases, large amounts of heat are generated and the conventional cooling techniques described above are inadequate. For example, high speed switching circuitry, such as is used in computers and telecommunication switching circuits, generate large amounts of heat. Also, power supply circuits frequently have devices with high power dissipation. Cryogenic cooling systems, wherein the electronic devices are immersed in a cooling liquid such as liquid nitrogen have been utilized to meet high capacity cooling requirements. While these systems are effective in providing high capacity cooling, they are complex and expensive. Therefore, cryogenic cooling systems are not cost-effective for relatively small systems having only a few very hot components.

It is an object of the present invention to provide improved apparatus for cooling electrical circuit components.

It is another object of the present invention to provide circuit component cooling apparatus having high cooling capacity.

It is yet another object of the present invention to provide circuit component cooling apparatus which is effective for use with one or a few heat-generating components.

It is still another object of the present invention to provide circuit component cooling apparatus which does not use a toxic heat transfer medium.

It is a further object of the present invention to provide circuit component cooling apparatus with an open loop heat transfer system wherein a cooling gas is released into the atmosphere after use.

It is a further object of the present invention to provide circuit component cooling apparatus which is relatively simple and low in cost.

SUMMARY OF THE INVENTION

According to the present invention, these and other objects and advantages are achieved in apparatus for cooling a circuit component comprising a source of fluid under pressure, expansion valve means for releasing a stream of gas from the source of fluid, and heat exchanger means in thermal contact with the circuit component and including a heat exchange surface. The expansion valve means is positioned to direct a steam of expanding gas over the heat exchange surface, so that the stream of gas absorbs thermal energy from the heat exchange surface by expansion cooling and thereby cools the circuit component.

In a preferred embodiment, the stream of gas is directed in a generally perpendicular direction at the heat exchanger surface, and the heat exchanger surface includes a plurality of fins defining grooves which direct the stream of gas outwardly away from the expansion valve means. The shape of the fins and the grooves can be selected to produce a desired cooling performance. The grooves increase in cross-sectional area with distance from the expansion valve means to accommodate the expanded gas volume. The axial contour of the grooves can be selected to produce a substantially uniform temperature distribution at the circuit component.

The cooling apparatus typically has an open loop configuration wherein the cooling gas is released into the atmosphere after use. As a result, a pump, conduits and associated components of a closed loop system are not required, and minor leaks do not present a serious problem. It is preferred that the fluid be nontoxic so that it can be released into the atmosphere through the expansion valve means without producing a hazardous condition. A preferred fluid is liquid carbon dioxide which evaporates upon passing through the expansion valve means and produces cooling by both expansion cooling and evaporative cooling.

According to another aspect of the present invention, there is provided a method for cooling a circuit component comprising the steps of providing a heat exchanger in thermal contact with the circuit component, the heat exchanger including a heat exchange surface and providing a source of fluid under pressure. The cooling method further includes releasing a stream of expanding gas from the source of fluid through an expansion valve such that thermal energy is absorbed by gas expansion, and directing the stream of gas across the heat exchange surface so that the gas absorbs thermal energy from the heat exchange surface, thereby cooling the circuit component.

According to yet another aspect of the present invention, there is provided an improved circuit assembly of the type including a support, an electrical connector attached to the support and a printed circuit board for removable engagement with the connector, the circuit board having a heat generating component thereon. The improvement comprises a heat exchanger in thermal contact with the heat generating component, and an expansion valve coupled to the support and having a fluid connection to a source of fluid. The expansion valve is positioned to direct a stream of expanding gas over a heat exchange surface of the heat exchanger when the circuit board is engaged in the connector, so that the stream of gas absorbs thermal energy from the surface and cools the heat generating component.

BRIEF DESCRIPTION OF THE DRAWINGS

For a better understanding of the present invention, together with other and further objects, advantages and capabilities thereof, reference is made to the accompanying drawings which are incorporated herein by reference and in which:

FIG. 1 is a schematic diagram, partially in cross-section, of cooling apparatus in accordance with the present invention;

FIGS. 2A and 2B are bottom and side views, respectively, of a heat exchanger utilized in the apparatus of the present invention;

FIG. 2C is a cross-sectional view, at a smaller scale, of the heat exchanger of FIG. 2A, taken through the line 2C—2C;

FIG. 3 illustrates an ideal temperature distribution in the heat exchanger utilized in the present invention;

DETAILED DESCRIPTION OF THE INVENTION

Figure 4:
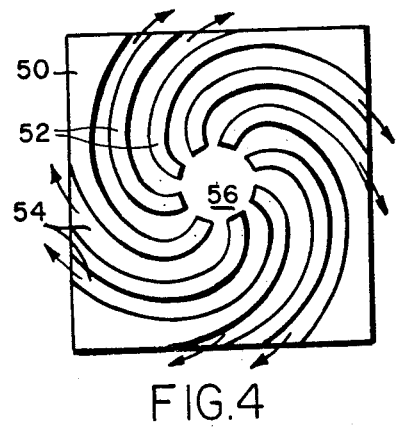
FIG. 4 illustrates a heat exchanger with a spiral fin structure for efficient thermal transfer.

Apparatus for cooling a circuit component in accordance with the present invention is illustrated in schematic form in FIG. 1. A semiconductor device 10 is attached in thermal contact with a surface of a heat exchanger 12 of thermally conductive material such as metal. The semiconductor device 10 is typically attached to the heat exchanger 12 with thermally conductive epoxy. A heat exchange surface 14 of the heat exchanger 12 opposite the surface to which the device 10 is attached includes a plurality of fins 16 radiating from a central axis 18. The fins 16 define grooves 20 as described in detail hereinafter.

A fluid source 26 is coupled through a conduit 28 and a shut-off valve 30 to an expansion valve 32. The fluid source 26 contains a pressurized gas or liquid which is released at a controlled rate through the expansion valve 32. When a pressurized gas is utilized, the gas expands and cools as it passes through the expansion valve 32. The expanded gas is available for absorption of thermal energy as described hereinafter. When a liquid is utilized, the liquid evaporates and expands as it passes through the expansion valve 32. In this case, more thermal energy is absorbed through both expansion cooling and phase transformation, or evaporative, cooling.

The expansion valve 32 is located on the axis 18 and is spaced a short distance from the heat exchange surface 14 so as to direct a stream of expanding gas along the axis 18 at the heat exchange surface 14. The expanding gas moves outwardly from the axis 1 over the heat exchange surface 14. A flow-directing surface 34 maintains the gas flow in proximity to the heat exchange surface 14.

One example of heat exchanger 12 is illustrated in FIGS. 2A–2C. A bottom view of the heat exchange surface 14 is shown in FIG. 2A, while FIG. 2B illustrates a side view of the heat exchanger 12. FIG. 2C is a cross-sectional view of the heat exchanger 12. The surface 14 includes a plurality of fins 16 extending radially from axis 18 to define the radial grooves 20 through which the expanding gas passes. FIG. 2A illustrates the grooves in a 45° sector of the heat exchange surface 14. Similar radial fins 16 cover the heat exchange surface 14. The grooves 20 increase in depth with distance from the axis 18 as best seen in FIG. 2C. As used herein, groove depth refers to the dimension in the direction of axis 18. The grooves 20 may increase in depth linearly or in accordance with a predetermined contour which produces a desired heat exchange relationship. The grooves 20 increase in cross-sectional area with distance from the axis 18 to accommodate the expanding gas introduced through the expansion valve 32. As the gas passes outwardly through the grooves 20, it passes over the walls of the fins 16 and absorbs heat therefrom.

As noted above, the fluid supplied from the source 26 can be a liquid or a gas under pressure. The gas which is released through the expansion valve 32 should be nontoxic so that it can be released into the atmosphere without danger to operating personnel. One preferred fluid is liquid carbon dioxide. The expansion valve 32 is typically a small orifice, such as a needle valve, through which a stream of expanding gas is released from the source 26. The shut-off valve 30 provides the capability to stop the flow of cooling gas when the circuit is not in operation.

The temperature distribution in the heat exchanger 12 can be tailored by an appropriate choice of groove designs. In particular, the contour of the groove depth can be selected to produce a uniform temperature distribution at the surface on which the semiconductor device 10 is mounted, as shown in FIG. 3. Near the axis 18 of the heat exchanger 12, the gas released by the expansion valve 32 is coolest and produces greatest cooling of the exchange surface 14. Near the outer portions 40 of heat exchanger 14, the gas has been heated. Thus, the temperature of the surface 14 increases radially outwardly. With an appropriate contour of the surface 14, the temperature distribution can be made uniform at the semiconductor device 10. In the example of FIG. 3, a uniform temperature of 75° is provided at the surface of the semiconductor device 10. Also, a desired nonuniform temperature distribution can be achieved if, for example, the semiconductor device 10 does not generate heat uniformly over its surface area.

In one example of the present invention, a one square centimeter chip was tested. A copper heat exchanger corresponding generally with FIGS. 2A and 2B was slightly larger than the chip and included radial grooves cut into the heat exchanger at an angle so that the depth sloped from a few thousandths of an inch on the axis 18 to about one-eighth inch at the periphery. The grooves 20 were separated by tapered fins 16 as shown in FIG. 2B. The expansion valve 32 was an adjustable needle valve mounted in direct contact with the heat exchanger fins 16, thereby maintaining close proximity between the point of expansion and the heat exchanger 12. A dissipation rate of 20 watts per square centimeter was measured, while maintaining a junction temperature of 100° C. The carbon dioxide flow rate was about 2.3 liters per minute of gas at 1 atmosphere pressure.

The cooling apparatus of the present invention is most efficient when the area of contact between the expanding gas and the heat exchange surface 14 is relatively large, since the transfer of thermal energy from the surface 14 to the gas occurs in a relatively small region near the surface 14. Thus, the heat exchange surface 14 must meet several requirements. The grooves defined by the fin structure must increase in cross-sectional area with distance from the axis 18 to accommodate the expansion of the gas. In addition, the area of contact between the gas and the fin surface must be as large as practical to insure efficient heat transfer. Thus, several small grooves are more efficient than one large one. Finally, the contour of the groove structure must produce the desired temperature distribution at the surface of the semiconductor device 10.

Figure 5:
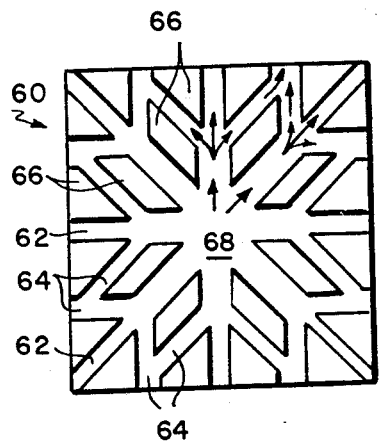
FIG. 5 illustrates a heat exchanger with a branching groove structure for efficient thermal transfer.

Alternate heat exchanger fin and groove structures are illustrated in FIGS. 4 and 5. A heat exchanger 50, shown in FIG. 4, includes spiral fins 52 which define between them spiral grooves 54. The grooves 54 increase in depth with distance from the center of the heat exchanger 50 to accommodate gas expansion. The spiral structure results in gas having more contact with fins 52 since the gas travels a distance from the center to the periphery which is greater than in the case of radial fins. The spiral structure also provides spiral fins 52 of uniform thickness, thereby reducing the fin volume and improving the heat exchange rate. In a central portion 56 of the heat exchanger 50, it is impractical to fabricate the spiral fin structure. In this region, a generally conical surface can be provided to guide the expanding gas outwardly toward the grooves 54.

A heat exchanger 60 having radial grooves 62 extending outwardly from the center thereof, and branch grooves 64 in an outer region thereof, is shown in FIG. 5. The grooves 64 branch from the radial grooves 62 so as to provide more area for contact between the expanding gas and the heat exchanger 60 surface. If the radial grooves 62 were simply increased in width, the relative area of contact between the gas and the fin surface would be less. In the heat exchanger 60, the radial grooves 62 and the branch grooves 64 are defined by fins 66. As in the previous heat exchangers, the grooves 62 and 64 increase in depth with distance from the center of the heat exchanger 60. A central portion 68 can have a conical shape to guide the expanding gas outwardly toward the grooves 62, 64.

The fin structures on the heat exchangers 12, 50 60 described hereinabove may be fabricated by electrical discharge machining using a preshaped foil structure as the electrode. The foil structure is pressed into the material of the heat exchanger during discharge, thereby forming the desired grooves.

Figure 6:
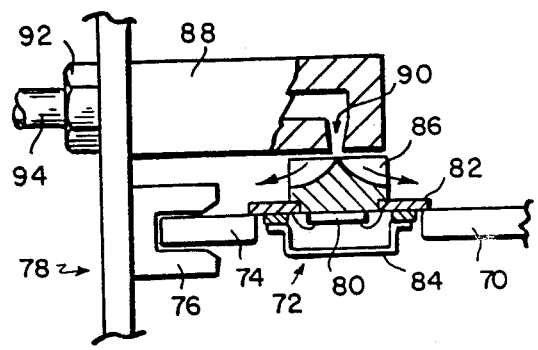
FIG. 6 illustrates an embodiment of the present invention wherein cooling is provided for a component mounted on a removable printed circuit board.

An application of the present invention to cooling a semiconductor device on a plug-in printed circuit board is shown in FIG. 6. A printed circuit board 70 has a heat-generating semiconductor device 72 mounted thereon. The board 70 has an edge connector 74 which plugs into a backplane connector 76 mounted on a backplane printed circuit board 78. The semiconductor device 72 includes a semiconductor chip 80 connected with conventional wire bonds through a metal/ceramic feed through 82 to conductive traces on the circuit board 70. The chip 80 is sealed with a hermetic cover 84. The semiconductor chip 80 is mounted in thermal contact with a heat exchanger 86 of the type shown and described hereinabove. A nozzle 88 provided with an expansion valve 90 is mounted directly to the backplane printed circuit board 78 with suitable mounting hardware 92. The nozzle 88 and the expansion valve 90 are positioned so that a stream of expanding gas released through the expansion valve 90 is directed at the center of the heat exchanger 86 surface. The nozzle 88 is connected by a conduit 94 through a shut-off valve (not shown) to a fluid source (not shown). The shut-off valve and the fluid source are connected to the expansion valve 90 as shown in FIG. 1.

In operation, gas from the fluid source is directed through expansion valve 90 onto heat exchanger 86 and cools the device 72. Since there is no connection between the expansion valve 90 and the heat exchanger 96, the printed circuit board 70 can easily be removed for servicing without the necessity for disconnecting the cooling apparatus. All that is required is to shut off the supply of gas.

Figure 7:
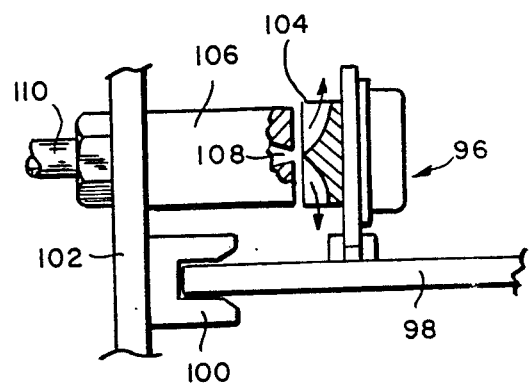
FIG. 7 illustrates an alternate embodiment for cooling a component mounted on a removable printed circuit board.

A variation of the assembly of FIG. 6 is shown in FIG. 7. A semiconductor device 96 is mounted vertically on a printed circuit board 98. The printed circuit board 98 plugs into a backplane connector 100 which is mounted on a backplane printed circuit board 102. A heat exchanger 104 is mounted on the back of the semiconductor device 96. A nozzle 106, having an expansion valve 108, is mounted to the backplane printed circuit board 102 and is connected by a conduit 110 to a fluid source (not shown).

The disclosed cooling apparatus provides the capability to remove large quantities of heat from a semiconductor device or other circuit component in a relatively simple and inexpensive manner. As a result of the open loop configuration wherein the cooling gas is released into the atmosphere, a pump, conduits and associated components of a closed loop system are not required. The apparatus is adapted for use with printed circuit boards and in applications having one or a few heat-generating components. Several heat exchangers and streams of expanding gas can be used when necessary. Also, the gas stream is not necessarily perpendicular to the heat exchanger and is not necessarily centrally located.

While there has been shown and described what is at present considered the preferred embodiments of the present invention, it will be obvious to those skilled in the art that various changes and modifications may be made therein without departing from the scope of the invention as defined by the appended claims.

What is claimed is:

1. Apparatus for cooling a circuit component comprising:
   heat exchanger means in thermal contact with said circuit component and including a heat exchange surface; and
   an open loop cooling assembly comprising a source of fluid under pressure and expansion valve means for releasing a stream of expending gas from said source of fluid, said expansion valve means being positioned in proximity to said heat exchange surface so that said stream of expanding gas passes over said heat exchange surface and absorbs thermal energy from said heat exchange surface by thermal expansion cooling and then is released into the ambient environment, said heat exchange surface including a plurality of fins defining grooves which direct said stream of expanding gas outwardly away from said expansion valve means, said grooves having an axial dimension parallel to an initial direction of said stream of expanding gas as it is released through said expansion valve means, said initial direction being substantially perpendicular to said heat exchange surface, said grooves increasing in axial dimension with distance from said expansion valve means.

2. Apparatus for cooling a circuit component as defined in claim 1 wherein said grooves increase in cross-sectional area with radial distance from said expansion valve means.

3. Apparatus for cooling a circuit component as defined in claim 1 wherein said grooves are defined by radial fins on said surface.

4. Apparatus for cooling a circuit component as defined in claim 1 wherein said fins have the form of spirals to increase the area of contact between said gas and said heat exchange surface.

5. Apparatus for cooling a circuit component as defined in claim 1 wherein said fins define grooves which branch outwardly from said expansion valve means thereby increasing the area of contact between said gas and said heat exchange surface.

6. Apparatus for cooling a circuit component as defined in claim 1 wherein said grooves are contoured in the axial direction to produce a desired temperature distribution at the circuit component.

7. Apparatus for cooling a circuit component as defined in claim 1 wherein said fluid comprises liquid $CO_2$.

8. Apparatus for cooling a circuit component as defined in claim 1 wherein said fluid is nontoxic and can be released into the atmosphere through said expansion valve means without hazard to operating personnel.

9. Apparatus as defined in claim 1 wherein said circuit component is a semiconductor device and said heat exchange surface is located opposite said semiconductor device and aligned therewith.

10. Apparatus for cooling a circuit component as defined in claim 1 further including a flow-directing surface spaced from said heat exchange surface for directing gas flow from said expansion valve means along said heat exchange surface.

* * * * *